(12) United States Patent
Then et al.

(10) Patent No.: US 9,240,410 B2
(45) Date of Patent: Jan. 19, 2016

(54) GROUP III-N NANOWIRE TRANSISTORS

(75) Inventors: Han Wui Then, Portland, OR (US); Robert Chau, Beaverton, OR (US); Benjamin Chu-Kung, Hillsboro, OR (US); Gilbert Dewey, Hillsboro, OR (US); Jack Kavalieros, Portland, OR (US); Matthew Metz, Portland, OR (US); Niloy Mukherjee, Portland, OR (US); Ravi Pillarisetty, Portland, OR (US); Marko Radosavljevic, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 280 days.

(21) Appl. No.: 13/976,413

(22) PCT Filed: Dec. 19, 2011

(86) PCT No.: PCT/US2011/065919
§ 371 (c)(1),
(2), (4) Date: Jun. 26, 2013

(87) PCT Pub. No.: WO2013/095343
PCT Pub. Date: Jun. 27, 2013

(65) Prior Publication Data
US 2013/0279145 A1  Oct. 24, 2013

(51) Int. Cl.
*H01L 27/088* (2006.01)
*H01L 29/66* (2006.01)
*H01L 29/775* (2006.01)
*H01L 29/778* (2006.01)
*H01L 29/786* (2006.01)
(Continued)

(52) U.S. Cl.
CPC ............. *H01L 27/0886* (2013.01); *B82Y 10/00* (2013.01); *H01L 29/0676* (2013.01); *H01L 29/66431* (2013.01); *H01L 29/66469* (2013.01); *H01L 29/775* (2013.01); *H01L 29/778* (2013.01); *H01L 29/7786* (2013.01); *H01L 29/785* (2013.01); *H01L 29/78696* (2013.01); *H01L 29/068* (2013.01); *H01L 29/0673* (2013.01); *H01L 29/2003* (2013.01); *Y10S 977/938* (2013.01)

(58) Field of Classification Search
None
See application file for complete search history.

(56) References Cited

U.S. PATENT DOCUMENTS 6,921,700 B2   7/2005  Orlowski et al.
8,815,683 B2*  8/2014  Kim ...................... B82Y 10/00
                                              257/24

(Continued)

OTHER PUBLICATIONS

International Search Report and Written Opinion mailed Aug. 30, 2012 for PCT/US2011/065919 filed Dec. 19, 2011, 10 pages.

*Primary Examiner* — Anthony Ho
*Assistant Examiner* — Samuel Lair
(74) *Attorney, Agent, or Firm* — Blakely, Sokoloff, Taylor & Zafman LLP

(57) ABSTRACT

A group III-N nanowire is disposed on a substrate. A longitudinal length of the nanowire is defined into a channel region of a first group III-N material, a source region electrically coupled with a first end of the channel region, and a drain region electrically coupled with a second end of the channel region. A second group III-N material on the first group III-N material serves as a charge inducing layer, and/or barrier layer on surfaces of nanowire. A gate insulator and/or gate conductor coaxially wraps completely around the nanowire within the channel region. Drain and source contacts may similarly coaxially wrap completely around the drain and source regions.

17 Claims, 10 Drawing Sheets

(51) Int. Cl.
*H01L 29/78* (2006.01)
*B82Y 10/00* (2011.01)
*H01L 29/06* (2006.01)
*H01L 29/20* (2006.01)

(56) References Cited

U.S. PATENT DOCUMENTS

| | | | |
|---|---|---|---|
| 2005/0136585 A1* | 6/2005 | Chau et al. | 438/214 |
| 2006/0214231 A1* | 9/2006 | Shah et al. | 257/347 |
| 2006/0216897 A1* | 9/2006 | Lee et al. | 438/282 |
| 2007/0004124 A1* | 1/2007 | Suk et al. | 438/238 |
| 2007/0029586 A1* | 2/2007 | Orlowski | 257/287 |
| 2008/0161073 A1 | 7/2008 | Park et al. | |
| 2009/0090934 A1* | 4/2009 | Tezuka et al. | 257/190 |
| 2010/0163926 A1* | 7/2010 | Hudait | H01L 29/1054 257/190 |
| 2010/0207208 A1* | 8/2010 | Bedell et al. | 257/346 |
| 2010/0252801 A1* | 10/2010 | Sekaric et al. | 257/9 |
| 2011/0031473 A1* | 2/2011 | Chang et al. | 257/24 |
| 2011/0156004 A1 | 6/2011 | Radosavljevi et al. | |
| 2011/0315950 A1* | 12/2011 | Sleight et al. | 257/9 |
| 2012/0068150 A1* | 3/2012 | Bangsaruntip et al. | 257/9 |
| 2013/0105897 A1* | 5/2013 | Bangsaruntip et al. | 257/351 |
| 2013/0270513 A1* | 10/2013 | Romero et al. | 257/9 |
| 2013/0307513 A1* | 11/2013 | Then et al. | 323/311 |
| 2014/0166981 A1* | 6/2014 | Doyle et al. | 257/24 |
| 2014/0175515 A1* | 6/2014 | Then | H01L 29/772 257/194 |

* cited by examiner

GROUP III-N NANOWIRE TRANSISTORS

CROSS-REFERENCE TO RELATED APPLICATION

This application is a U.S. National Phase application under 35 U.S.C. §371 of International Application No. PCT/US2011/065919, filed Dec. 19, 2011, entitled GROUP III-N NANOWIRE TRANSISTORS.

TECHNICAL FIELD

Embodiments of the present invention generally relate to microelectronic devices and fabrication, and more particularly to group III-N transistors.

BACKGROUND

Systems on a chip (SoC) have been implemented in a number of capacities over the last few decades. SoC solutions offer the advantage of scaling which cannot be matched by board-level component integration. While analog and digital circuits have long been integrated onto a same substrate to provide a form of SoC that provides mixed signal capabilities, SoC solutions for mobile computing platforms, such as smart phones and tablets, remain elusive because these devices typically include components which operate with two or more of high voltage, high power, and high frequency. As such, conventional mobile computing platforms typically utilize group III-V compound semiconductors, such a GaAs heterojunction bipolar transistors (HBTs), to generate sufficient power amplification at GHz carrier frequencies, and laterally diffused silicon MOS (LDMOS) technology to manage voltage conversion and power distribution (battery voltage regulation including step-up and/or step-down voltage conversion, etc.). Conventional silicon field effect transistors implementing CMOS technology is then a third device technology utilized for logic and control functions within a mobile computing platform.

The plurality of transistor technologies utilized in a mobile computing platform limits scalability of the device as a whole and is therefore a barrier to greater functionality, higher levels of integration, lower costs, and smaller form factors, etc. While an SoC solution for the mobile computing space that would integrate two or more of these three device technologies is therefore attractive, one barrier to an SoC solution is the lack of a scalable transistor technology having both sufficient speed (i.e., sufficiently high gain cutoff frequency, $F_t$), and sufficiently high breakdown voltage (BV).

One promising transistor technology is based on group III-nitrides (III-N). However, this transistor technology faces fundamental difficulties in scaling to feature sizes (e.g., gate length) less than 100 nm where short channel effects become difficult to control. Scaled III-N transistors with well-controlled short channel effects are therefore important to achieving high $F_t$, with sufficiently high breakdown voltage (BV). For an SoC solution to deliver the product specific electrical current and power requirements of a mobile computing platform, fast switching high voltage transistors capable of handling high input voltage swings and providing high power added efficiencies at RF frequencies are needed. An advanced III-N transistor amenable to scaling and such performance is therefore advantageous.

BRIEF DESCRIPTION OF THE DRAWINGS

Embodiments of the present invention are illustrated by way of example, and not by way of limitation, and can be more fully understood with reference to the following detailed description when considered in connection with the figures, in which.

DETAILED DESCRIPTION

Figure 1A:
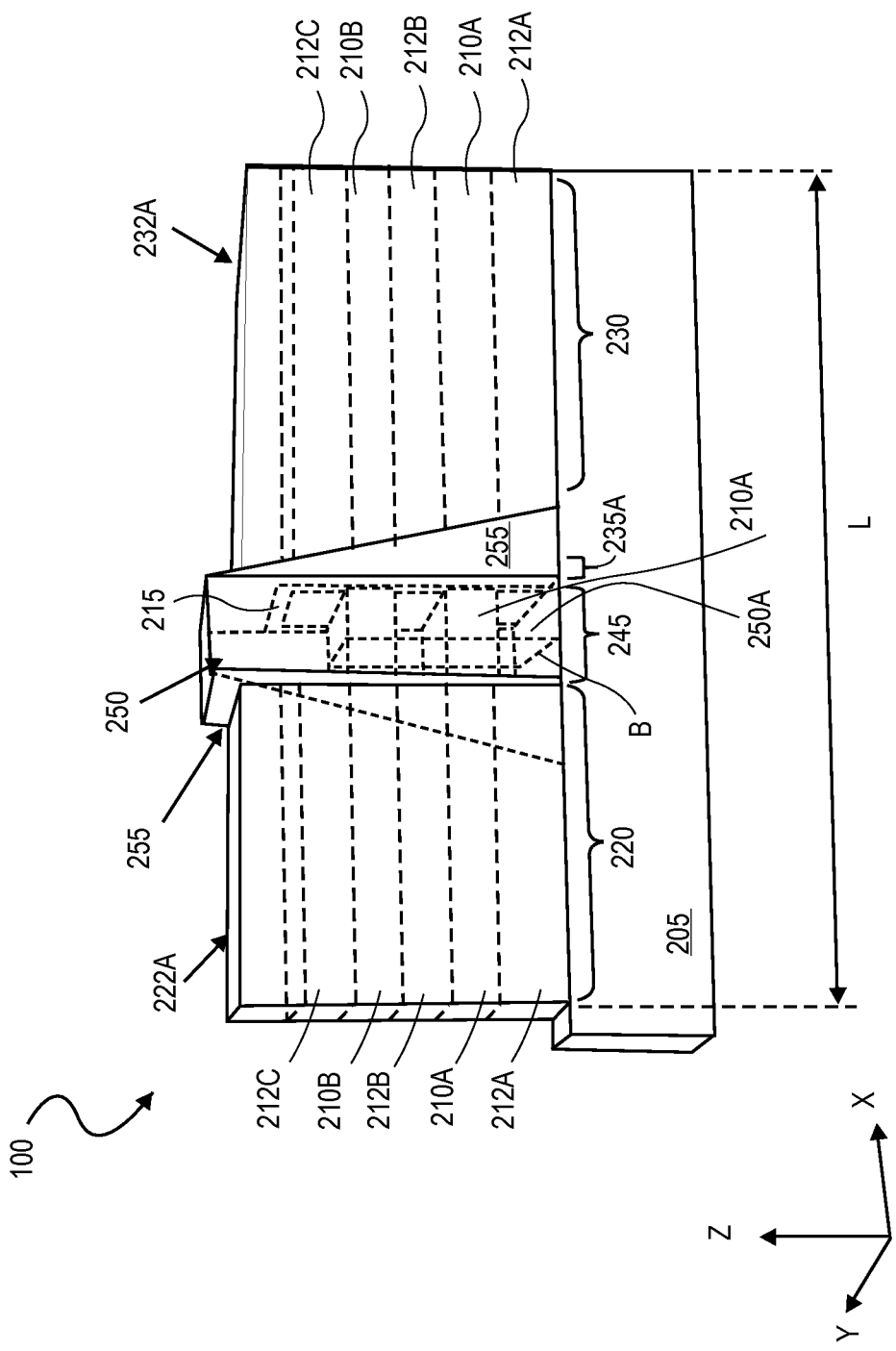
FIG. 1A is an isometric illustration of a group III-N transistor, in accordance with an embodiment.

In the following description, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer.

Described herein are embodiments of group III-nitride (III-N) semiconductor nanowires and fabrication techniques to enable the fabrication of high voltage, high bandwidth field effect transistors. In particular embodiments, such transistors are employed in SoC architectures integrating high power wireless data transmission and/or high voltage power management functions with low power CMOS logic data processing. The nanowire structure entails a "gate-all-around" for excellent electrostatic control of short-channel effects, and thus, permit ultra-scaling of group III-N transistors into the sub-100 nm regime. High frequency operation suitable for broadband wireless data transmission applications is possible while the use of large bandgap III-N materials also provides a high BV such that sufficient RF output power may be generated for the wireless data transmission applications. This combination of high $F_t$ and high voltage capability also makes possible the use of the transistors described herein for high speed switching applications in DC-to-DC converters utilizing inductive elements of reduced size. As both the power amplification and DC-to-DC switching applications are key functional blocks in smartphones, tablets, and other mobile platforms, the structures described herein may be utilized in a SoC solution for such devices.

In embodiments, a multi-layered semiconductor structure, which may include a plurality of group III-N materials is leveraged to form a nanowire, a plurality of vertically stacked nanowires, and may be further utilized to incorporate a semiconductor materials having a differing bandgap into various regions of the transistor (e.g., a wider bandgap material may be incorporated in an extrinsic drain region between the device channel and the drain contact). In the exemplary embodiments, gate structures wrap around all sides of the channel region to provide fully gated confinement of channel charge for scaling of gate lengths ($L_g$). Depending on the embodiment, one or more surfaces of the nanowire are covered with a wide bandgap group III-N material to provide one or more of enhanced channel mobility, sheet charge [two dimensional electron gas (2DEG)] by spontaneous and piezo-electric polarization, passivation of interfacial states, and energy barriers for channel charge carrier confinement.

FIG. 1A is an isometric illustration of a group III-N transistor 100, in accordance with an embodiment. Generally, the group III-N transistor 100 is a gate voltage controlled device (i.e., a FET) commonly referred to as a high electron mobility transistor (HEMT). The group III-N transistor 100 includes at least one non-planar crystalline semiconductor body that is on a plane parallel to a top surface of a substrate layer 205 upon which the transistor 100 is disposed. In an embodiment, the substrate layer 205 is insulating or semi-insulating and/or has an insulating or semi-insulating layer disposed there on, over which the nanowire 210A is disposed. In one such embodiment, the substrate layer 205 is a top layer of group III-N semiconductor grown (depicted in FIG. 1A) on a support substrate or transferred onto a donor substrate (support and donor substrates not depicted). In a particular embodiment, the substrate layer 205 includes a silicon support substrate, upon which the group III-N layer is epitaxially grown, however, the support substrate may also be of alternate materials, which may or may not be combined with silicon, including, but not limited to, germanium, indium antimonide, lead telluride, indium arsenide, indium phosphide, gallium arsenide, or gallium antimonide, carbon (SiC), and sapphire. In another embodiment, the substrate layer 205 upon which the transistor 100 is disposed is a dielectric layer, so that the substrate layer 205 is a buried oxide (BoX) which may be formed for example by transferring one or more layers of the semiconductor from which the nanowire 210A is formed onto the substrate layer 205.

As further illustrated in FIG. 1A, a longitudinal length L of the group III-N transistor 100 is divided between a source region 220, a channel region 145, a drain region 230, and an extrinsic drain region 235A disposed there between. The extrinsic drain region 235A is specifically highlighted as it has a significant effect on BV of the device. Within at least the channel region 245, the non-planar crystalline semiconductor body is physically separated from the substrate layer 205 by an intervening material other than the crystalline semiconductor forming the body or the material forming the substrate layer 205 to form a laterally oriented nanowire 210A. For the embodiments described herein, the transverse cross-sectional geometry of the nanowire 210A may vary considerably from circular to rectangular such that the thickness of the nanowire 210A (i.e., in z dimension) may be approximately equal to a width of the nanowire 210A (i.e., in y dimension) or the thickness and width of the nanowire 210A may be significantly different from each other (i.e., physically akin to a ribbon, etc.) to form cylindrical and parallelepiped semiconductor bodies. For the exemplary embodiments, the width of the nanowire 210A is between 5 and 50 nanometers (nm), but this may vary depending on implementation.

Within the channel region 245, the nanowire 210A has much greater long range order than a polycrystalline material. In the exemplary embodiment, the channel region 245 is substantially single crystalline and although is referred to herein as "monocrystalline," one of ordinary skill will appreciate that a low level of crystal defects may nevertheless be present as artifacts of an imperfect epitaxial growth process. Within the channel region 245, the nanowire 210A is a crystalline arrangement of a first semiconductor material including one or more group III elements and nitrogen (i.e., a group III-N semiconductor). Generally, this first group III-nitride material in the channel region 245 should have relatively high carrier mobility and therefore in embodiments, the channel region 245 is to be a substantially undoped group III-nitride material (i.e., impurity concentration minimized) for minimal impurity scattering. In a first exemplary embodiment, the channel region 245 is GaN. In a second exemplary embodiment, the channel region 245 is indium nitride (InN). Because InN has a greater carrier mobility the GaN (2700 $cm^2/Vs$ as compared to 1900 $cm^2/Vs$), transistor metrics, such as specific on resistance ($R_{on}$), may be relatively better for InN embodiments. In a third exemplary embodiment, the channel region 245 is a ternary alloy of GaN, such as aluminum gallium nitride ($Al_xGa_{1-x}N$), where x is less than 1. In a fourth exemplary embodiment, the channel region 245 is a ternary alloy of InN, such as aluminum indium nitride ($Al_xIn_{1-x}N$), where x is less than 1. In further embodiments, the channel region 245 is a quaternary alloy including at least one group III element and nitrogen, such as $In_xAl_yGa_{1-x-y}N$.

Figure 1B:
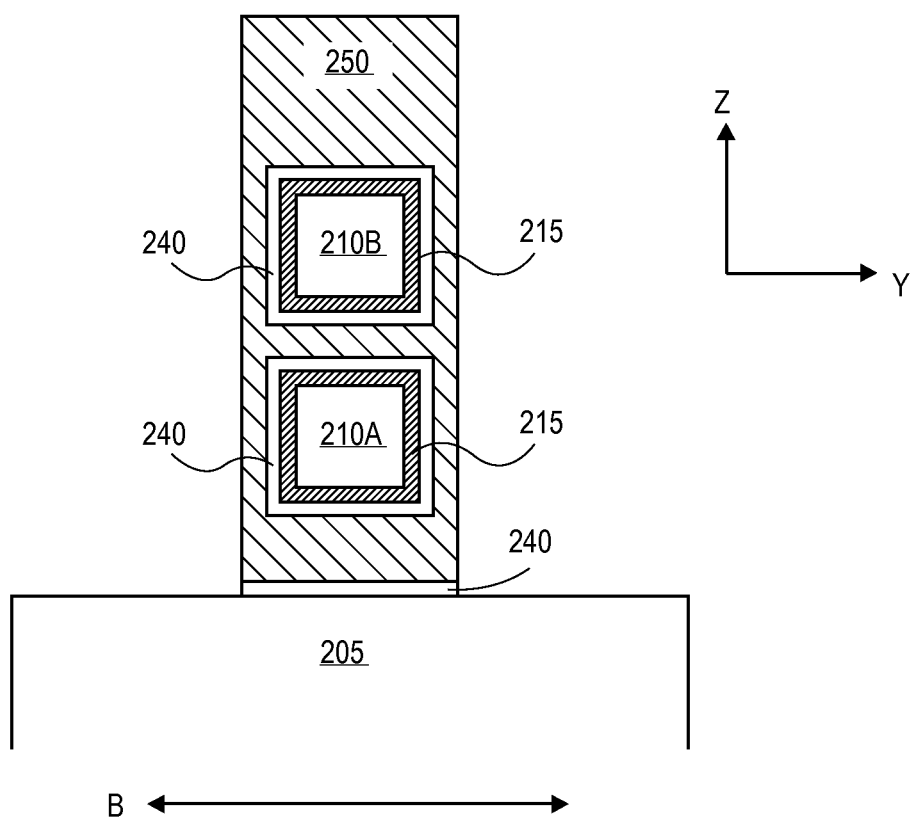
FIG. 1B is a cross-sectional view of a channel region of the group III-N transistor illustrated in FIG. 1A.

Within at least the channel region 245, the nanowire 210A is covered with a second semiconductor layer 215 disposed over one or more of the sidewalls, top, and/or bottom surfaces of the nanowire 210A. In the exemplary embodiment, the semiconductor layer 215 is disposed directly at least two opposite surfaces of the nanowire 210A. FIG. 1B is a cross-sectional view along the B plane through the channel region 245 of the group III-N transistor 200 illustrating the semiconductor layer 215 as disposed on all perimeter surfaces of nanowire 210A (and nanowire 210B). As further illustrated in FIG. 2A, the semiconductor layer 215 also covers the nanowire 210A within the extrinsic drain region 235A where the layer 215 functions as a charge inducing layer.

The semiconductor layer 215 is of a second semiconductor composition having a wider bandgap than that of the group III-N material utilized in the nanowire 210A within the channel region 245. Preferably, the crystalline semiconductor layer 215 is substantially monocrystalline (i.e., having a thickness below the critical thickness), lattice matched to the group III-N material utilized in the nanowire 210A within the channel region 245. In the exemplary embodiment, the semiconductor layer 215 is of a second group III-N material having the same crystallinity as that of the nanowire 210 to form a quantum-well heterointerface within the channel region 245.

Generally, any of the group III-N materials described for the nanowire 210A may be utilized for the semiconductor layer 215, as dependent on the material selected for the nanowire 210A to provide the semiconductor layer 215 with a larger bandgap than the nanowire 210A. In a first exemplary embodiment where the nanowire 210A is GaN, the semiconductor layer 215 is MN. In a second exemplary embodiment where the nanowire 210A is InN, the semiconductor layer 215 is GaN. In a third embodiment where the nanowire 210A is $Al_xIn_{1-x}N$, the semiconductor layer 215 is $Al_yIn_{1-y}N$, where y is greater than x. In a fourth embodiment where the nanowire 210A is $Al_xGa_{1-x}N$, the semiconductor layer 215 is $Al_yGa_{1-y}N$, where y is greater than x. Quaternary alloys including at least one group III element and nitrogen, such as $Al_{1-x-y}In_xGa_yN$ (x,y<1), are also possible. The semiconductor layer 215 may further comprise any multilayer stack of these Group III-Nitrides, for example, an $Al_xIn_{1-x}N$/AlN stack with the MN layer of the stack adjacent to the (e.g., GaN) nanowire 210A.

Even where the semiconductor layer 215 is present on all surfaces of the nanowire 210A (top, bottom, and sidewalls), as depicted in FIG. 1B, though thickness may vary. The semiconductor layer 215 serves at least two functions within the channel region 245. The two functions are a result of the asymmetry induced by the polar bonds within the semiconductor crystalline body 210A and the polarization direction stemming from these bonds with respect to the semiconductor layer 215. Depending on the crystal orientation of the nanowire 210A, various opposing surfaces of the nanowire 210A are aligned with different crystal planes so that the effect of an electric field resulting from the semiconductor layer 215 on these opposing surfaces varies.

Figure 2A:
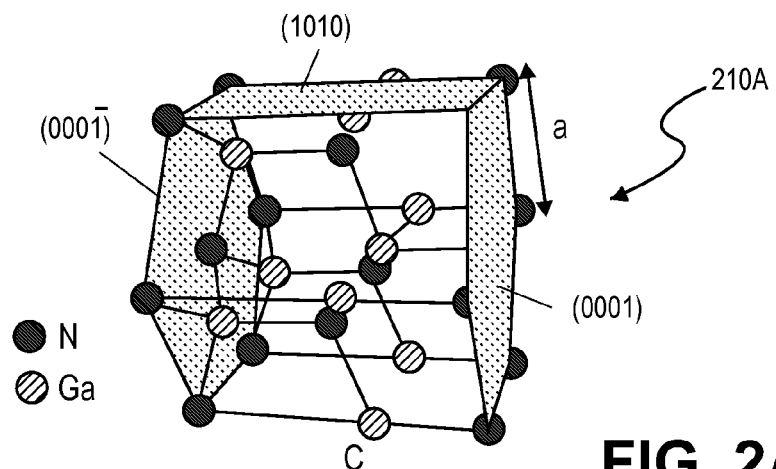
FIG. 2A is a isometric illustration of a GaN crystal orientation for a group III-N transistor, in accordance with an embodiment.

In one embodiment, illustrated by FIG. 2A, the group III-nitride of the nanowire 210A has the crystal structure is known as the wurtzite structure. The GaN and other group III-nitrides described herein may be formed with the wurtzite structure which is notable in that it is non-centrosymmetric meaning that the crystal lacks inversion symmetry, and more particularly the {0001} planes are not equivalent. For the exemplary GaN embodiment, one of the {0001} planes is typically referred to as the Ga-face (+c polarity) when and the other referred to as the N-face (−c polarity). Often for planar group III-N devices, one or the other of {0001} planes is more proximate a substrate surface and so may be referred to as Ga polarity (+c) if the three bonds of the Ga (or other group III element) point towards the substrate or N polarity (−c) if the three bonds of the Ga (or other group III element) point away from the substrate. For a first embodiment of the group III-N transistor 200 however, the wurtzite crystal orientation is such that the (1010) plane having lattice constant c forms a top surface of the crystal and interfaces the substrate layer 205.

Figure 2B:
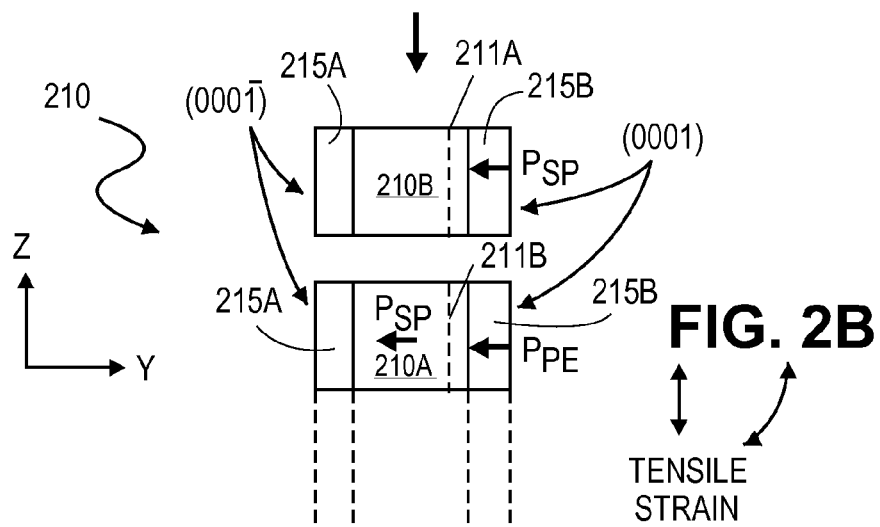
FIG. 2B is a cross-sectional view of a channel region of a group III-N transistor employing a non-planar GaN body having the crystal orientation illustrated in FIG. 2A.

As further illustrated in FIG. 2B, where the nanowire 210A has the group III-nitride material oriented as in FIG. 2A, the semiconductor layer 215 includes sidewall portions 215A and 215B which function as a charge inducing layer on one of the sidewalls (e.g., 215B) such that a 2DEG 211A may be formed in the nanowire 210A adjacent to the semiconductor layer 215. As so oriented, the semiconductor layer sidewall portion 215A may further serve as a back barrier to confine charge carriers within the channel region 245. As shown, the first sidewall portion 215A is substantially along the (000$\bar{1}$) plane such that the majority of the surface of the first sidewall portion 215A is on the (000$\bar{1}$) plane of the nanowire 210A. Similarly, the second sidewall portion 215B is substantially along the (0001) plane such that the majority of the surface of the second sidewall 110B is defined by the (0001) plane. The spontaneous polarization field, $P_{SP}$ within the nanowire 210A is therefore directed from the second sidewall portion 215B to the first sidewall portion 215B. As such, the polarization of the non-planar group III-N transistor 200 is through the width of the nanowire 210A (laterally along the y-dimension).

As further illustrated in FIG. 2B, because of the crystallinity of the semiconductor layer 215 a spontaneous polarization field, $P_{SP}$, is also present within the semiconductor layer 215 and is aligned with that of the nanowire 210A. Furthermore, when the semiconductor layer 215 is under tensile strain in a direction parallel to the height dimension of the sidewall portions 215A and 215B (along z-dimension as shown in FIG. 2B), a piezoelectric polarization field $P_{PE}$ is also aligned with $P_{SP}$ in a direction from the second sidewall portion 215B to the first sidewall portion 215A. The polarizations of the nanowire 210A and the semiconductor layer 215 therefore form a polarization field at the heterointerface along the (0001) plane proximate to the second sidewall portion 215B. As described by Maxwell's equations, the polarization field induces the 2DEG 211A.

Figure 2C:
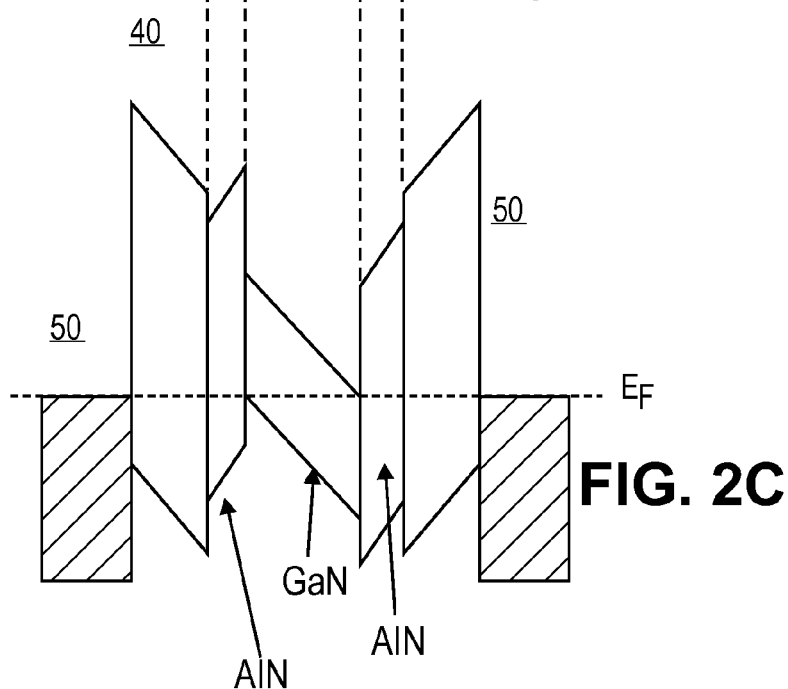
FIG. 2C is a band diagram for the channel region illustrated in FIG. 2B.
Figure 2D:
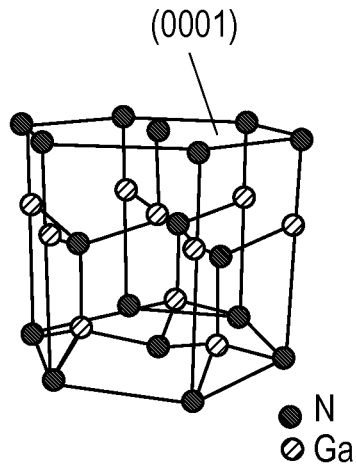
FIG. 2D is a isometric illustration of a GaN crystal orientation for a group III-N transistor, in accordance with an embodiment.
Figure 2E:
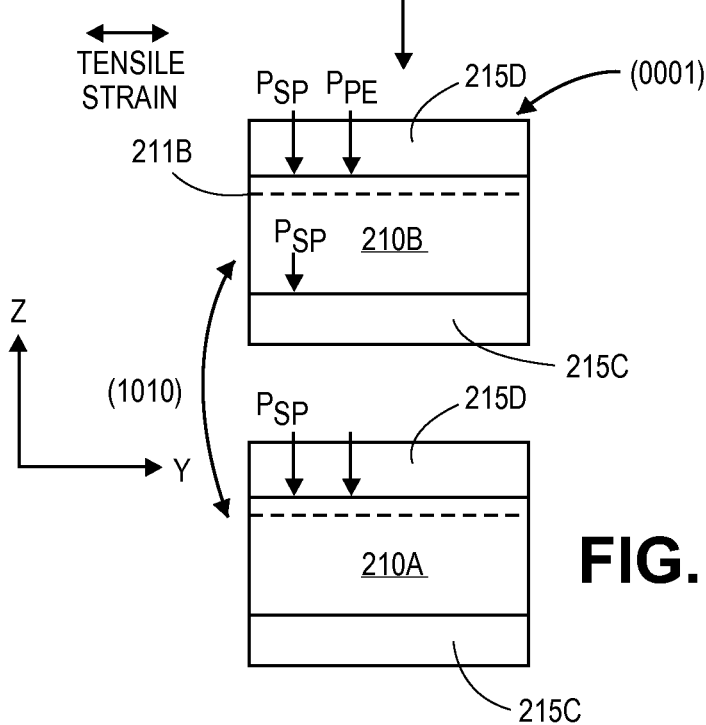
FIG. 2E is a cross-sectional view of a channel region of a group III-N transistor employing a non-planar GaN body having the crystal orientation illustrated in FIG. 2D.

For a second embodiment of the group III-N transistor 200, the wurtzite crystal orientation is such that the (0001) plane having lattice constant a forms a top surface of the crystal and interfaces the substrate layer 205, as illustrated in FIG. 2D. For this embodiment, as further illustrated in FIG. 4E, the semiconductor layer 215 present on the top and bottom of the nanowire 210A (215D and 215C) functions as charge inducing layer and back barrier, respectively. The semiconductor layer 215 spontaneous polarization field, $P_{SP}$ within the nanowire 210A is then directed from the top surface portion 215D to the bottom surface portion 215C. As such, the polarization of the non-planar group III-N transistor 200 is through the thickness of the nanowire 210A (vertically along the z-dimension). As illustrated in FIG. 2E, the polarizations of the nanowire 210A and the semiconductor layer portions 215D and 215C therefore form polarization fields at the heterointerface along the (0001) plane and (000$\bar{1}$), respectively, with the polarization field inducing the 2DEG 211A adjacent to a top surface of the nanowire 210A.

In either crystal orientation (FIG. 2A or FIG. 2D), both back barrier and charge inducing layer are gated by the gate stack 250. FIG. 2C is a band diagram of a non-planar group III-nitride transistor formed from the non-planar crystalline semiconductor body illustrated in FIG. 2B, with the wrap around gate structure as illustrated in FIG. 1A, in accordance with the exemplary embodiment where the nanowire 210A (and nanowire 210B) is GaN and the semiconductor layer 215 is AlN. As shown in FIG. 2C, at zero gate bias the bands are asymmetrical across the cross-sectional width of the nanowire 210A and between the semiconductor layer portion 215A and the semiconductor layer portion 215B. At the location within the nanowire 210A where the band bends below the Fermi level $E_F$ from the polarization field, charge carriers are present. As illustrated by the band diagram, the symmetrical gate structure illustrated in FIG. 1B has an asymmetrical function arising from the polarity of the nanowire 210A. The gate conductor 250 proximate to the semiconductor layer portion 215B therefore modulates the charge carrier density of the 2DEG 111 within the channel region while the gate conductor 250 proximate to the semiconductor layer portion 215A modulates the back barrier. For the orientation in FIG. 2D, the same gated back barrier is provided where the gate conductor fills between the nanowire 210A and the substrate layer 205 to coaxially wrap completely around the nanowire 210A, as illustrated in FIG. 1A by the dashed lines within the channel region 245. The band diagram of FIG. 2C is therefore also applicable to the crystal orientation of FIG. 2D.

As further shown in FIG. 1B, the gate stack includes a gate conductor 250 electrically isolated from the nanowire 210A by a gate dielectric material 240 disposed under the gate conductor to reduce leakage current between the gate conductor and the nanowire 210A. As the gate stack 250A is disposed over the semiconductor layer 215, the semiconductor layer 215 and the gate dielectric material of the gate stack 215 may be considered a composite dielectric stack. In the embodiment illustrated in FIG. 1B, the gate dielectric material 240 is further disposed between the substrate layer 205 and the gate conductor 250. As shown in FIG. 1A, coaxially wrapping entails the gate conductor within the region 250A disposed between the nanowire 210A and the substrate layer 205.

Generally, the gate dielectric material 240 may include one or more of any material known in the art suitable for FET gate dielectrics, and is preferably a high K dielectric (i.e., having a dielectric constant greater than that of silicon nitride ($Si_3N_4$)), such as, but not limited to, high K oxides like gadolinium oxide ($Gd_2O_3$), hafnium oxide ($HfO_2$), high K silicates such as HfSiO, TaSiO, AlSiO, and high K nitrides such as HfON. Similarly, the gate conductor 250 may be of any material known in the art for transistor gate electrodes. In an embodiment, the gate conductor 250 includes a work function metal which may be selected to obtain a desired threshold voltage ($V_t$) (e.g., greater than 0V, etc). Exemplary conductive gate materials include, tungsten (W), aluminum (Al), titanium (Ti), tantalum (Ta), nickel (Ni), molybdenum (Mo), germanium (Ge), platinum (Pt), gold (Au), ruthenium (Ru), palladium (Pd), iridium (Ir), their alloys and silicides, carbides, nitrides, phosphides, and carbonitrides thereof.

Returning to FIG. 1A, the nanowire 210A further includes a source region 220 and drain region 230. In the exemplary embodiment, within the source region 220 and drain region 230, the nanowire 210A is the same group III-nitride semiconductor material present in the channel region 245, but may further include a higher concentration of dopant, such as an n-type impurity (i.e., N+). In certain embodiments, the nanowire 210A within the source region 220 and drain region 230 maintains the same monocrystallinity as within the channel region 245. In a first embodiment, a semiconductor material layer 212A is in contact with the nanowire 210 within the source and/or drain regions 220, 230. For the group III-nitride transistor 200, the nanowire 210A is sandwiched between semiconductor material layers 212A and 212B. In the exemplary embodiment, where the semiconductor material layer 212A facilitates an undercut of the nanowire 210A within the channel region 245, the semiconductor material layer 212A is of a different material than the nanowire 210A.

In embodiments, the semiconductor material layer 212A is any of the group III-nitrides described for embodiments of the nanowire 210A that is other than the one utilized for the nanowire 210A. For example, the semiconductor material layer 212A may be MN, GaN, InN, $Al_zIn_{1-z}N$, or $Al_zGa_{1-z}N$, where z is different than x. In one embodiment, the semiconductor material layer 212A has a lower bandgap than that of the nanowire 210A (e.g., z less than x where both the nanowire 210A and semiconductor material layer 212A is ternary) to help reduce source/drain contact resistance. In an alternate embodiment, the semiconductor material layer 212A has a higher bandgap than that of the nanowire 210A (e.g., z greater than x where both the nanowire 210A and semiconductor material layer 212A is ternary). Where the group III-nitride of nanowire 210A and the group III-nitride of the semiconductor material layer 212A is alloyed or intermixed, the bandgap within extrinsic drain region 235A may be advantageously increased to be intermediate of the bandgap in the channel region 245 and the bandgap of the semiconductor material layer 212A, enabling an even higher BV. As such, depending on the embodiment, the transistor 100 may incorporate a semiconductor that is sacrificial within the channel region 245 to selectively decrease or increase the bandgap of the semiconductor material employed in the channel region 245.

Figure 1C:
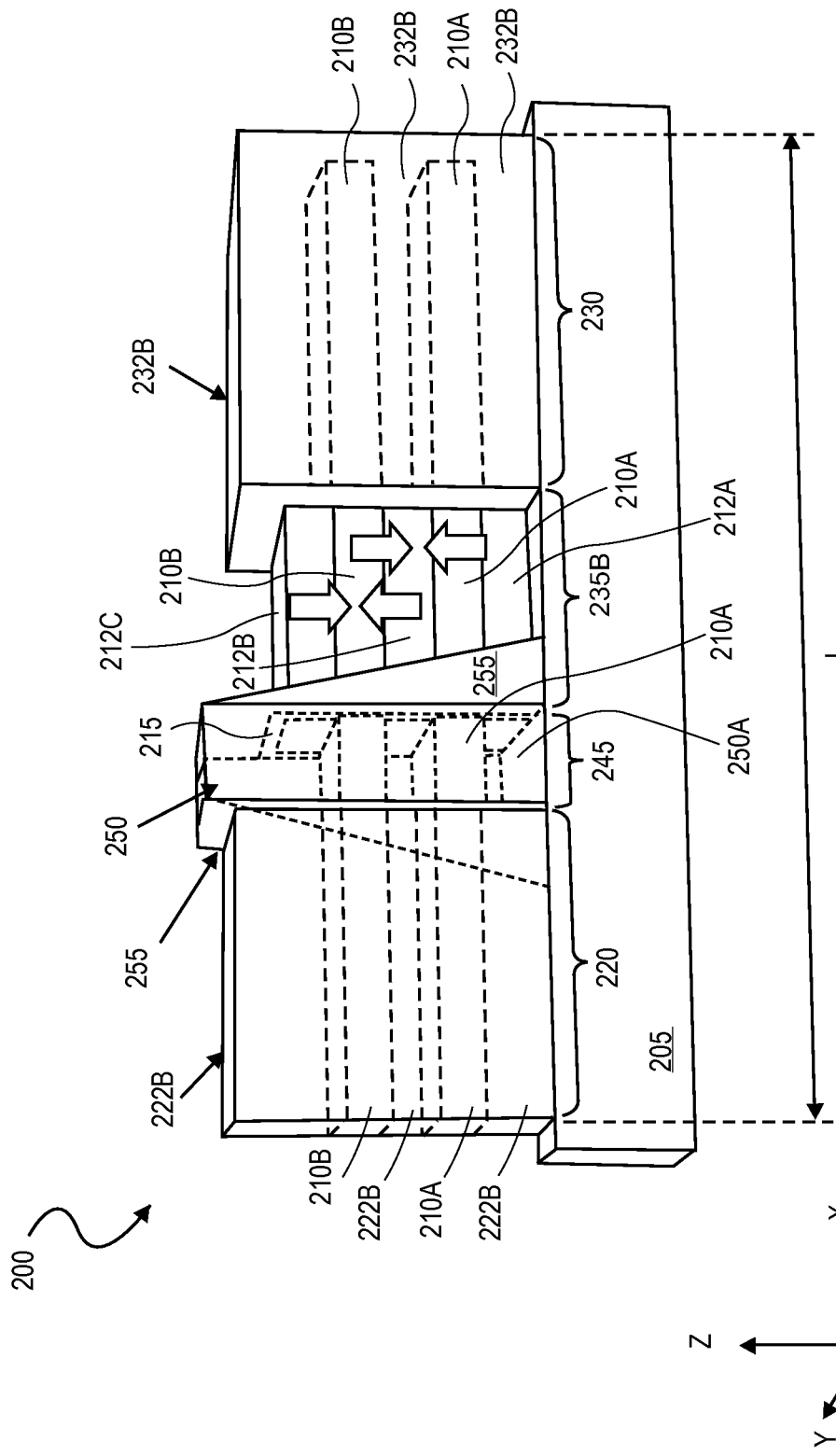
FIG. 1C is an isometric illustration of a group III-N transistor, in accordance with an embodiment.

FIG. 1C is an isometric illustration of a group III-N transistor 200, in accordance with an embodiment. While the group III-N transistor 100 has an extrinsic drain region 235A that is approximately equal to the spacing between a source contact 222A and the channel region 245 (i.e., determined by the dielectric spacer 255) the group III-N transistor 200 has an extrinsic drain region 235B that is greater than the spacing between the source contact 222B and the channel region 245. The extrinsic drain regions 235A, 235B may be lightly doped and further include the semiconductor layer 215, as illustrated in both FIGS. 1A and 1C. Within the extrinsic drain regions 235A, B the semiconductor layer 215 functions as a charge inducing layer and because the longitudinal length of the extrinsic drain region is a function the BV desired, the group III-N transistor 200 has a greater BV than the group III-nitride transistor 100.

In one exemplary embodiment, the extrinsic drain region 235B is an alloy of the first and second semiconductor materials to provide a bandgap intermediate between to those of the first and second semiconductor materials. As illustrated by the open arrows in FIG. 1C, within the extrinsic drain region 235B, the alloy of the first and second semiconductor materials is in the form of an a disordered multilayer structure. The multilayer structure includes a group III-nitride material of the nanowire 210A, extending through the extrinsic drain region 235B and coupling the channel region 245 to a drain region 230, sandwiched between semiconductor material layers 212A and 212B. With opposing sides of the nanowire 210A adjacent to the semiconductor material layers 212A and 212B, good alloy uniformity may be achieved within the portion of the extrinsic drain region 235B.

In an embodiment a group III-nitride transistor includes a source region and/or drain region of a nanowire embedded with a source and/or drain contact. FIG. 1C illustrates a source contact 222B that coaxially wraps completely around the nanowire 210A to fill in the gap between the nanowire 210A and the substrate layer 205. As shown in FIG. 1A, the source contact 222A does not completely wrap around the nanowire 210A because the semiconductor layers 212A and 212B remain. The source contacts 222A, 222B may includes an ohmic metallization layer and may further include an epitaxially grown semiconductor of different composition than the nanowire 210A. For example, the source contacts 222A, 222B may include a tunnel junction (e.g., a p+ layer wrapping around the nanowire 210A within the source region 220). Ultra steep turn on and off (i.e., improved subthreshold performance) may be provided with such a tunnel junction for reduced off state leakage current.

The nanowire 210A further includes a drain region 230. Like the source region, the drain region may be more or less embedded within a drain contact 232. In FIG. 1C, a drain contact 232B coaxially wraps completely around the nanowire 210A within the drain region 230 to fill in the gap between the nanowire 210A and the substrate layer 205. As shown in FIG. 1A, the drain contact 232A does not completely wrap around the nanowire 210A because the semiconductor layers 212A and 212B remain. Like the source contacts 222A, 222B, the drain contacts 232A, 232B may include an ohmic metallization layer and may also further include an epitaxially grown semiconductor of different composition than the nanowire 210A.

In embodiments, as shown in FIGS. 1A and 1C, a group III-N transistor includes a vertical stack of nanowires to achieve a greater current carrying capability (e.g., larger drive currents) for a given footprint over a substrate layer. Any number of nanowires may be vertically stacked, depending on fabrication limitations, with the longitudinal axis of each of the nanowire substantially parallel to a top surface of the substrate layer 205. In the exemplary embodiment illustrated in FIG. 1A or 1C, each of the nanowires 210A, 210B is of the same first semiconductor material within the channel region 245. In further embodiments, each of the nanowires 210A and 210B is coaxially wrapped by the gate stack 250A (e.g., as further shown in FIGS. 1B, 2B, and 2E). At least the gate dielectric layer 240 is to be disposed between the nanowires 210A and 210B, but in the exemplary embodiment shown in FIG. 1B, the gate conductor is also present between the channel regions of each of the nanowires 210A, 210B.

In the embodiment illustrated in FIG. 1C, each of the plurality of nanowires 210B are physically coupled together by semiconductor material in the extrinsic drain region 235B. For embodiments including a plurality of nanowires 210A, 210B, the group III-N transistors 100, 200 have a plurality of drain regions, one for each nanowire within the vertical stack of nanowires. Each drain region may be coaxially wrapped with the drain contact (e.g., 232B) coaxially wrapping completely around each of the drain regions filling in the gaps between the nanowires 210A, 210B. Similarly, the source contact 222B may coaxially wrap complete around a plurality of source regions.

Figure 3:
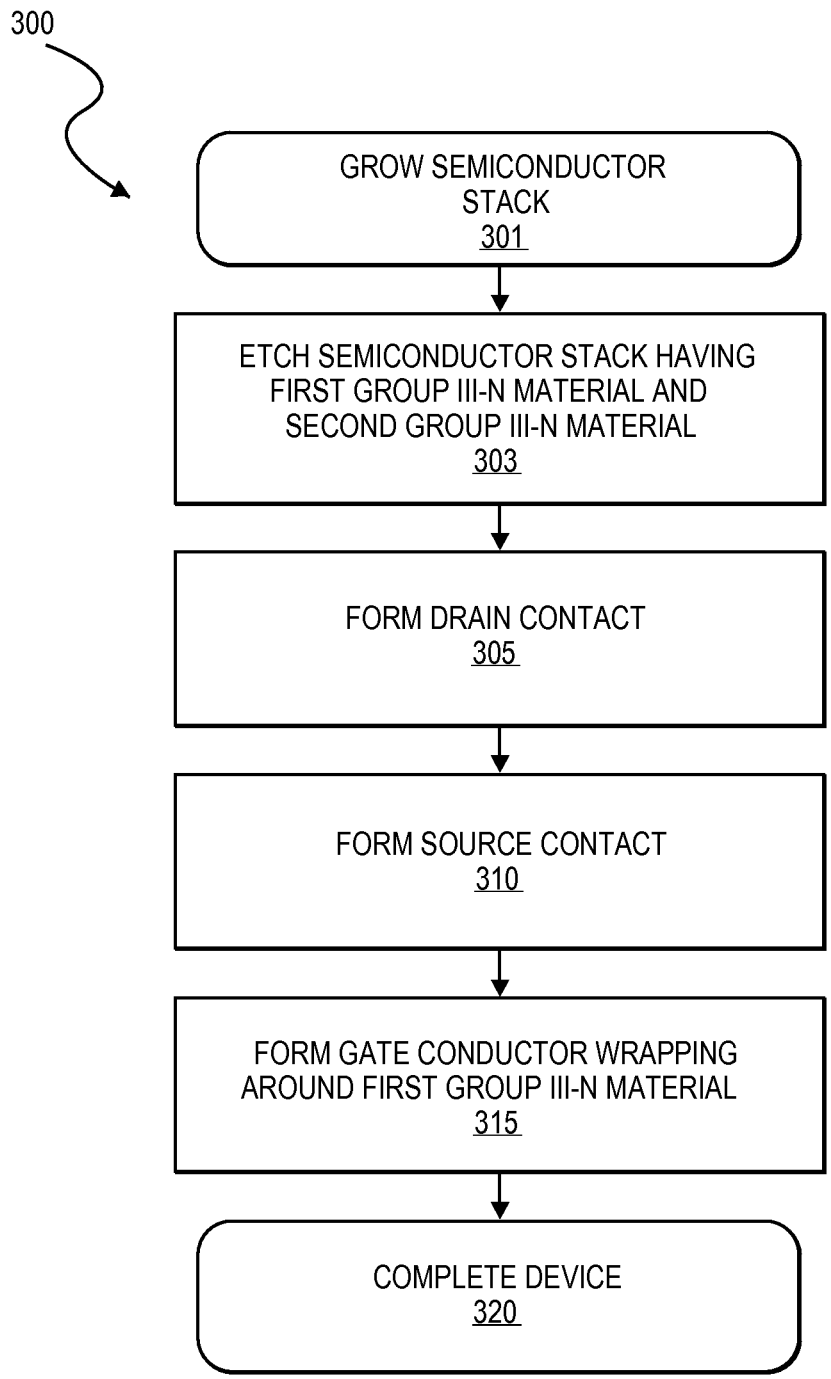
FIG. 3 is a flow diagram illustrating a method of fabricating a non-planar high voltage transistor, in accordance with an embodiment.

A brief description of salient portions of the fabrication process for each of the transistors 200 and 201 is now provided. FIG. 3 is a flow diagram illustrating a method 300 of fabricating the non-planar high voltage transistors 200 and 201, in accordance with an embodiment. While method 300 highlights the main operations, each operation may entail many more process sequences, and no order is implied by the numbering of the operations or relative positioning of the operations in FIG. 3. FIGS. 4A, 4B, 4C, 4D and 4E are isometric illustrations of the non-planar group III-N transistors 100, 200 fabricated in accordance with an embodiment of the method 300.

At operation 301, a stack of monocrystalline semiconductor materials is grown using any standard chemical vapor deposition (CVD), molecular beam epitaxy (MBE), hydride vapor phase epitaxy (HVPE) growth technique, etc., (with standard precursors, temperatures, etc.). At least two different semiconductor layers are grown as part of the epitaxial stack. In an embodiment, the layers 212A, 212B, and 212C are a first group III-nitride material with a second group III-nitride disposed between them.

Figure 4A:
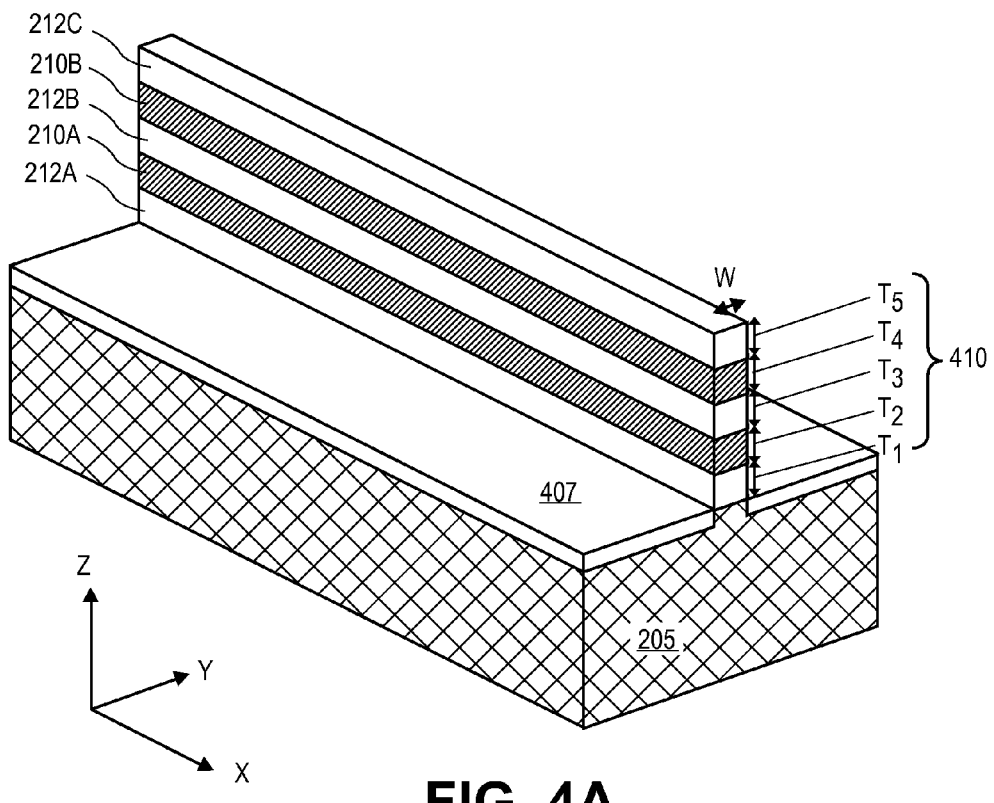
FIGS. 4A, 4B, 4C, 4D and 4E are isometric illustrations of a non-planar high voltage transistor fabricated in accordance with an embodiment of the method illustrated in FIG. 3.

At operation 305, a nanowire is defined (e.g., length and width) by etching the epitaxial stack with any plasma or wet chemical etch technique known in the art for the particular materials grown as part of the epitaxial stack. As shown in FIG. 4A, at operation 303 the fin structure 410 is etched into an epitaxial stack of to form nanowires 210A, 210B alternating with semiconductor layers 212A, 212B, and 212C. As shown each of the nanowires 210A and 210B are disposed both above and below the semiconductor layers 212A, 212B. The layer thicknesses, $T_1$-$T_4$ are dependent on the desired nanowire dimensions and also on the ability to backfill the thicknesses $T_1$, $T_3$ with the gate stack after the semiconductor layer 215 is formed on the nanowires 210A and 210B. Also shown in FIG. 4A, an insulator layer 407 is formed on either side of the fin structure 410 over the substrate layer 205, for example by a shallow trench isolation technique.

Returning to FIG. 3, at operation 305, a drain contact is formed to wrap around the nanowire 210A and 210B either partially (as in FIG. 1A) or completely (as in FIG. 1C). At operation 310, a source contact is similarly formed. At operation 315 a gate conductor is coaxially wrapped completely around the nanowires 210A and 210B longitudinal channel length of. The device is then completed at operation 320, for example using conventional interconnect techniques.

Figure 4B:
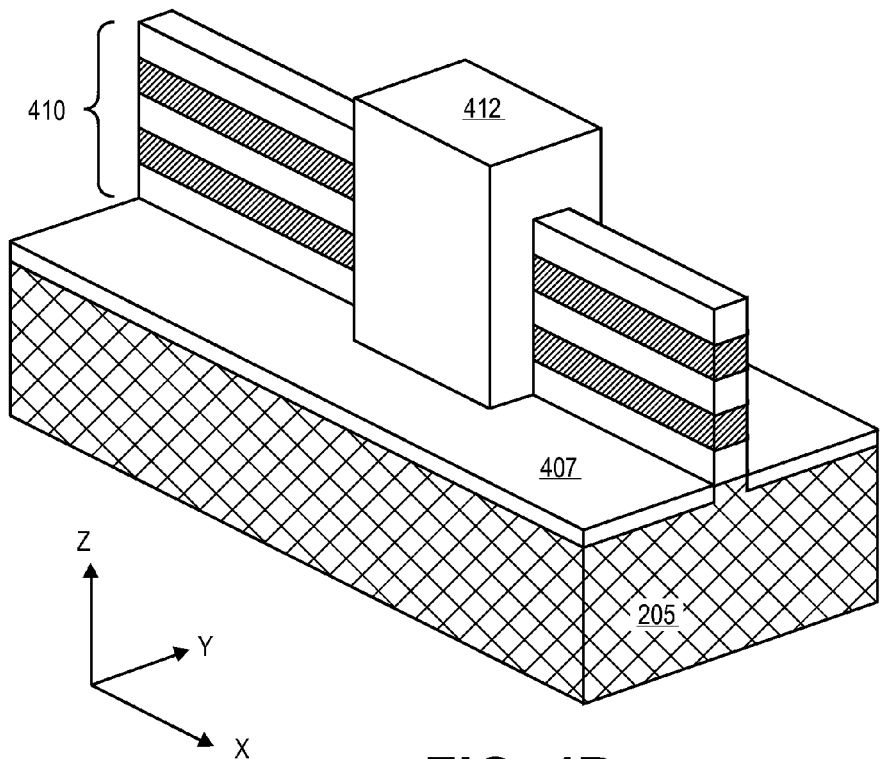
Figure 4C:
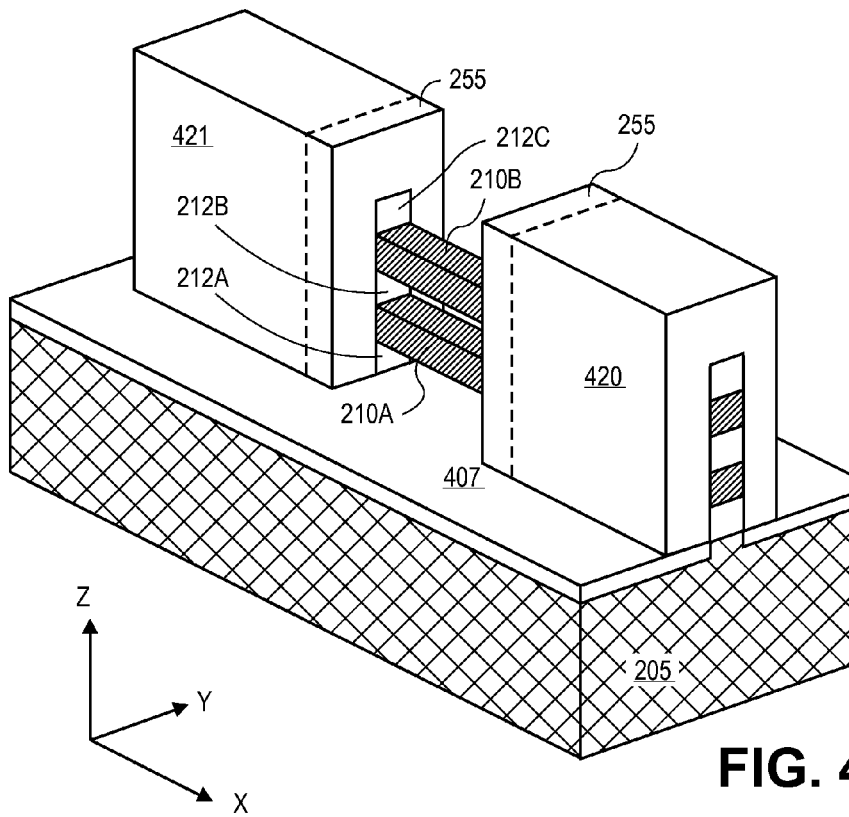

FIG. 4B illustrates one embodiment of the operations 305, 310 and 315 entailing formation of a sacrificial gate 412 disposed on the fin structure 410. In one such embodiment, the sacrificial gate 412 is composed of a sacrificial gate oxide layer and a sacrificial polysilicon gate layer which are blanket deposited and patterned with a conventional lithographic and plasma etch process. Spacers may be formed on the sidewalls of the sacrificial gate 412 and an interlayer dielectric layer may be formed to cover the sacrificial gate 412. The interlayer dielectric layer may be polished to expose the sacrificial gate 412 for a replacement gate, or gate-last, process. Referring to FIG. 4C, the sacrificial gate 412 has been removed, leaving spacers 255 and portion of the interlayer dielectric layer (ILD) 420, 421. As further shown in FIG. 4C, the semiconductor layers 212A, 212B, and 212C are removed in the channel region originally covered by the sacrificial gate 412. Discrete nanowires 210A and 210B of the first semiconductor material then remain.

Figure 4D:
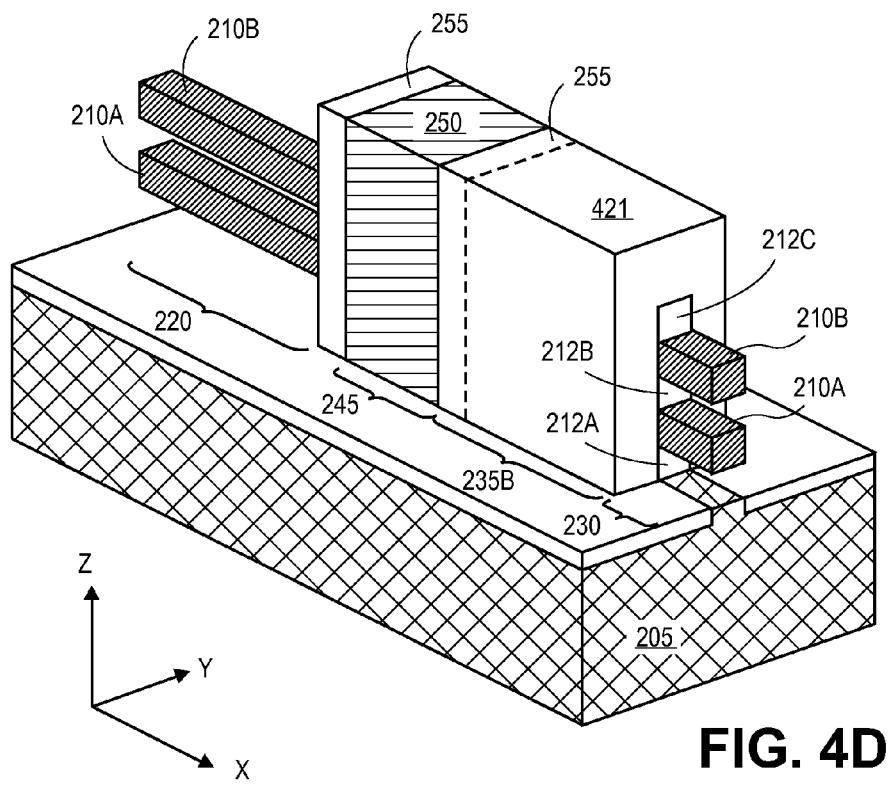

As shown in FIG. 4D, the gate stack 250A is then formed coaxially wrapping around the nanowires 210A, 210B within the channel region 245. FIG. 4D illustrates the gate stack following epitaxial growth of the semiconductor layer 215, deposition of the gate dielectric 240, and deposition of the gate conductor 250 to backfill the gap formed by selectively etching the semiconductor layers 212A, 212B, and 212C. That is, the gate stack is formed in the trench between the interlayer dielectric layers 420, 421 after etching the epitaxial stack into discrete group III-N nanowires. Additionally, FIG. 4D depicts the result of the subsequent removal of the interlayer dielectric layer 420 after formation of the gate stack 250A. For embodiments including the extrinsic drain region 235B (e.g., group III-nitride transistor 200), a portion of the interlayer dielectric layer 421 is retained (e.g., with a lithographically defined masked etch of the interlayer dielectric) within the extrinsic drain region 235A. For alternate embodiments (e.g., for transistor group III-nitride transistor 100) no portion of the ILD 421 is retained.

For embodiments which include source and drain contacts coaxially wrapping completely around the nanowires 210A, 210B, once the ILD layers 420, 421 are removed, the portions of the semiconductor layers 212A and 212B not protected by the gate stack (and any portion of the interlayer dielectric layer 421 remaining) are then removed selectively relative to the nanowires 210A, 210B of the first semiconductor material to form a gap between the nanowires 210A, 210B and the substrate layer 205. Discrete portions of the first semiconductor then remain in the source and drain regions 220 and 230, as depicted in FIG. 4D. The source and drain contacts 222, and 232 (as illustrated in FIG. 2A) may then be formed by backfilling the gaps formed within in the source and drain regions 220, 230. In one such embodiment, a contact metal is conformally deposited by CVD, atomic layer deposition (ALD), or metal reflow. In alternative embodiments, source and drain contacts 222A, 232A are formed on the semiconductor layers 212A and 212B as well as sidewalls of the nanowires 210A and 210B within the source and drain regions. The devices are then ready to be completed at operation 320, for example with conventional interconnect metallization, etc.

Figure 4E:
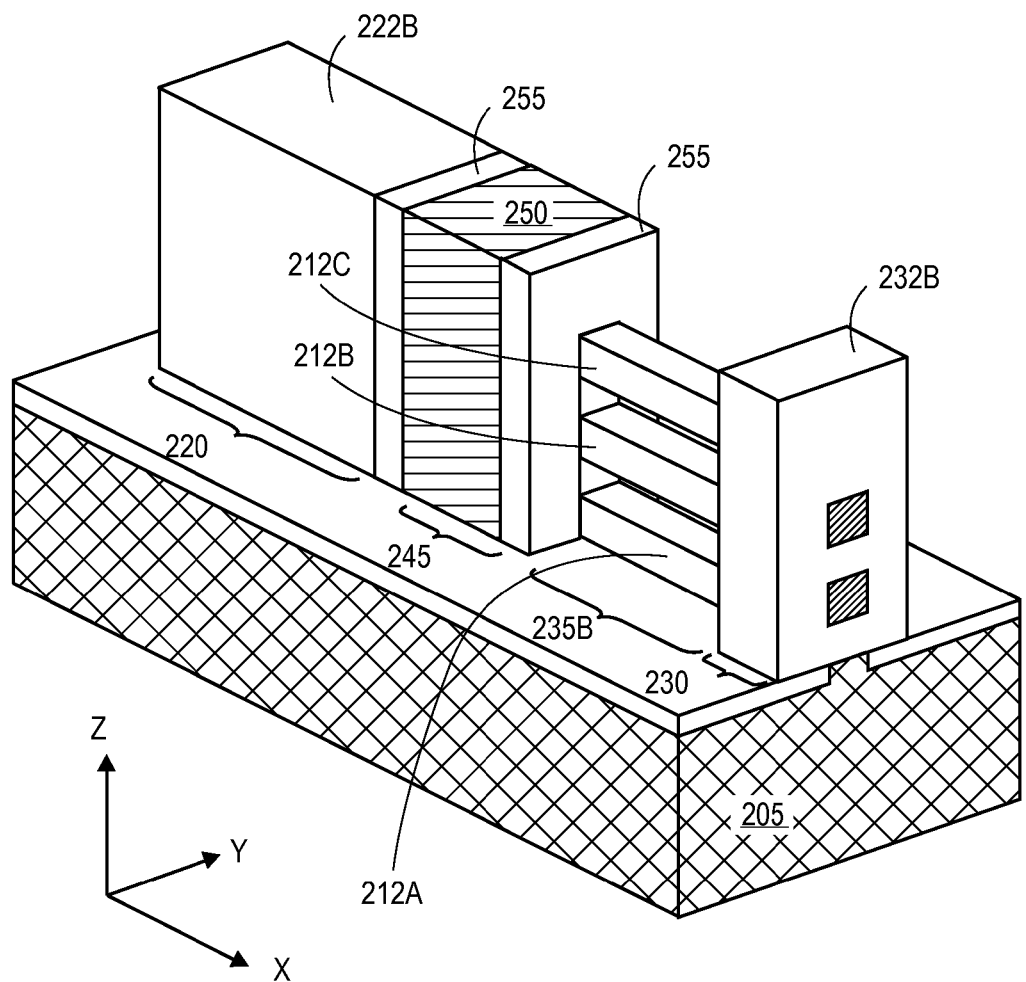

In a further embodiment, illustrated by FIG. 4E, any retained portion of the ILD 421 may removed selectively to the spacers 255, gate conductor 250, and source, drain contacts 222B, 232B. One of the nanowires 210A, 210B and the semiconductor layers 212A, 212B, 212C may then be removed selectively over the other of the nanowires 210A, 210B and the semiconductor layers 212A, 212B, 212C. In the exemplary embodiment, a crystalline semiconductor material that has a larger bandgap than that of the nanowires 210A, 210B is then epitaxially regrown in the undercut gap(s). Semiconductor layers 212A, 212B, 212C may then function as charge inducing layers within the extrinsic drain region 235B. Semiconductor layer 215 may additionally be grown on sidewalls of the nanowires 210A, 210B (e.g., where the crystal orientation is as in FIG. 2B). Alternatively, or in addition, a diffusive element, such as Al, Ga, or Zn may be incorporated on the first semiconductor within the extrinsic drain region 235B after the remaining portion of the ILD 421 is removed.

In embodiments, the semiconductor materials present within the extrinsic drain region 235B are alloyed by a thermal annealing. For example, the first semiconductor material 210A, 210B and semiconductor layers 212A, 212B, and 212C may be intermixed (i.e., multilayered structure disordering). Alternatively, the thermal annealing may intermix the semiconductor materials with the diffusive element (e.g., Al, Ga, or Zn). In one such embodiment, the thermal anneal is simultaneous with the formation of the source and drain contacts (e.g., operations 305 and 310). Notably, replacement of the sacrificial gate 412 may occur after formation of the source and drain contacts 222, 232 and/or after annealing of the extrinsic drain region 235B. Also, the semiconductor layer 215 may be grown after thermal annealing of the extrinsic drain region 235B to maintain an abrupt heterointerface between the semiconductor layer 215 and the nanowires 210A, 210B within the channel region 245 and/or extrinsic drain region 235B.

Figure 5:
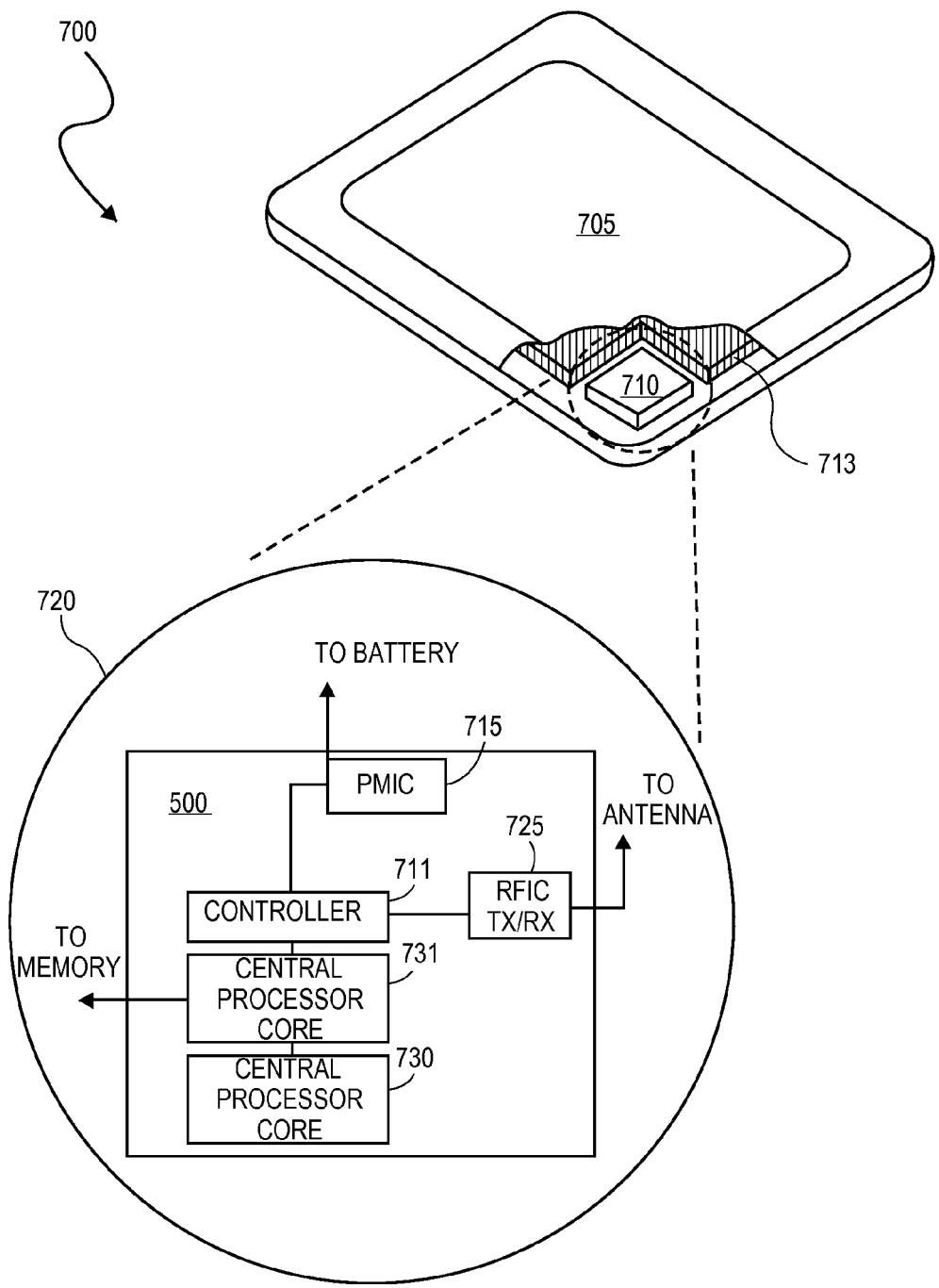
FIG. 5 is a functional block diagram of an SoC implementation of a mobile computing platform, in accordance with an embodiment of the present invention.

FIG. 5 is a functional block diagram of a SoC implementation of a mobile computing platform, in accordance with an embodiment of the present invention. The mobile computing platform 700 may be any portable device configured for each of electronic data display, electronic data processing, and wireless electronic data transmission. For example, mobile computing platform 700 may be any of a tablet, a smart phone, laptop computer, etc. and includes a display screen 705 that is in the exemplary embodiment a touchscreen (e.g., capacitive, inductive, resistive, etc.) permitting the receipt of user input, the SoC 710, and a battery 713. As illustrated, the greater the level of integration of the SoC 710, the more of the form factor within the mobile computing device 700 that may be occupied by the battery 713 for longest operative lifetimes between charging, or occupied by memory (not depicted), such as a solid state drive for greatest functionality.

Depending on its applications, mobile computing platform 700 may include other components including, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The SoC 710 is further illustrated in the expanded view 720. Depending on the embodiment, the SoC 710 includes a portion of a silicon substrate 500 (i.e., a chip) upon which two or more of a power management integrated circuit (PMIC) 715, RF integrated circuit (RFIC) 725 including an RF transmitter and/or receiver, a controller thereof 711, and one or more central processor core 730, 731 is fabricated. As will be appreciated by one of skill in the art, of these functionally distinct circuit modules, CMOS transistors are typically employed exclusively except in the PMIC 715 and RFIC 725, which typically utilize LDMOS and III-V HBT technologies, respectively. In embodiments of the present invention however, the PMIC 715 and RFIC 725 employ the group III-nitride transistors described herein (e.g., group III-nitride transistor 100 or 200). In further embodiments the PMIC 715 and RFIC 725 employing the group III-nitride transistors described herein are integrated with one or more of the controller 711 and processor cores 720, 730 provided in silicon CMOS technology monolithically integrated with the PMIC 715 and/or RFIC 725 onto the silicon substrate 500. It will be appreciated that within the PMIC 715 and/or RFIC 725, the high voltage, high frequency capable group III-nitride transistors described herein need not be utilized in exclusion to CMOS, but rather silicon CMOS may be further included in each of the PMIC 715 and RFIC 725

The RFIC 725 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The platform 725 may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The group III-nitride transistors described herein may be specifically utilized where a high voltage swings present (e.g., 7-10V battery power regulation, DC-to-DC conversion, etc. within the PMIC 715). As illustrated, in the exemplary embodiment the PMIC 715 has an input coupled to the battery 713 and has an output provide a current supply to all the other functional modules in the SoC 710. In a further embodiment, where additional ICs are provided within the mobile computing platform 700 but off the SoC 710, the PMIC 715 output further provides a current supply to all these additional ICs off the SoC 710. As further illustrated, in the exemplary embodiment the RFIC 715 has an output coupled to an antenna and may further have an input coupled to a communication modules on the SoC 710, such as an RF analog and digital baseband module (not depicted). Alternatively, such communication modules may be provided on an IC off-chip from the SoC 710 and coupled into the SoC 710 for transmission. Depending on the group III-nitride materials utilized, the group III-nitride transistors described herein (e.g., 200 or 201) may further provide the large power added efficiency (PAE) needed from a power amplifier transistor having an $F_t$ of at least ten times carrier frequency (e.g., a 1.9 GHz in an RFIC 725 designed for 3G or GSM cellular communication).

It is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A group III-N transistor, comprising:
a nanowire disposed on a substrate, wherein a longitudinal length of the nanowire further comprises:
a channel region of a first group III-N material;
a source region electrically coupled with a first end of the channel region; and
a drain region electrically coupled with a second end of the channel region,
a gate stack comprising a gate insulator and a gate conductor coaxially wrapping completely around the channel region, and
a second group III-N material disposed between the first group III-N material and gate stack along at least a portion of the channel region.

2. The group III-N transistor of claim 1, wherein the second group III-N material is to provide a back barrier with a heterojunction formed along a first surface of the nanowire, and to induce a 2DEG within the channel region with a heterojunction along a second surface of the nanowire.

3. The group III-N transistor of claim 1, wherein the first surface is along a top surface of the nanowire, opposite the substrate, and wherein the second surface is along a bottom surface sidewall, opposite the top surface.

4. The group III-N transistor of claim 1, wherein the nanowire is disposed within a vertical stack of nanowires, wherein each of nanowires has a channel region consisting essentially of the first group III-N material, and wherein at least two of the plurality of nanowires are physically coupled together at a point along the longitudinal length by a third crystalline semiconductor material different than the first group III-N material.

5. The group III-N transistor of claim 4, wherein the third semiconductor has a larger bandgap than that of the first group III-N material.

6. The group III-N transistor of claim 5, wherein the first and third semiconductor materials comprise an epitaxial stack, wherein the nanowires each have a longitudinal axis extending parallel to the substrate.

7. The group III-N transistor of claim 1, wherein the drain region is separated from the channel region by an extrinsic drain region comprising a third group III-N material having a wider bandgap than that of the first group III-N material.

8. The high voltage transistor of claim 7, wherein the extrinsic drain region is an alloy of the first and third group III-N materials with a bandgap intermediate between those of the first and third group III-N materials.

9. The group III-N transistor of claim 1, further comprising:
a drain contact coaxially wrapping completely around the drain region; and
a source contact coaxially wrapping completely around the source region.

10. The group III-N transistor of claim 1, wherein the first group III-N material consists essentially of GaN, or consists essentially of InN, or consists essentially of $Al_xIn_{1-x}N$, where x is less than 1, or consists essentially of $Al_xGa_{1-x}N$, where x is less than 1.

11. The group III-N transistor of claim 10, wherein the second group III-N comprises AlN, GaN, $Al_yIn_{1-y}N$, or $Al_yGa_{1-x}N$, where y is greater than x.

12. The group III-N transistor of claim 11, wherein the third group III-N comprises AlN, GaN, InN, $Al_zIn_{1-z}N$, or $Al_zGa_{1-z}N$, where z is different than x.

13. The group III-N transistor of claim 12, wherein the drain region consists essentially of the first group III-N material.

14. A system on chip (SoC), comprising:
a power management integrated circuit (PMIC) including at least one of a switching voltage regulator or switching mode DC-DC converter; and
an RF integrated circuit (RFIC) including a power amplifier operable to operate with a cut-off frequency, $F_t$ and maximum oscillation frequency, $F_{max}$ of both at least 20 GHz, and generate a carrier wave frequency of at least 2 GHz, wherein both of the PMIC and RFIC are monolithically integrated onto a same substrate, and wherein at least one of PMIC and RFIC include the high voltage transistor of claim 1.

15. The SoC of claim 14, further comprising:
a controller of at least one of the PMIC and RFIC integrated onto the substrate, wherein the controller comprises CMOS technology fabricated with silicon field effect transistors.

16. A mobile computing device, comprising:
a touchscreen;
a battery;
an antenna; and
the SoC of claim 14, wherein the PMIC is coupled to the battery and wherein the RFIC is coupled to the antenna.

17. The mobile computing device of claim 16, further comprises a first and second processor core, each core operably coupled to the touchscreen, the PMIC and RFIC, wherein the first and second processor cores comprise CMOS technology fabricated with silicon field effect transistors.

* * * * *